(12) United States Patent
Takahiro et al.

(10) Patent No.: US 7,955,869 B2
(45) Date of Patent: Jun. 7, 2011

(54) NONVOLATILE MEMORY DEVICES AND METHODS OF FABRICATING THE SAME

(75) Inventors: Yasue Takahiro, Suwon-si (KR); Byeong-Ok Cho, Seoul (KR); Moon-Sook Lee, Seoul (KR)

(73) Assignee: Samsung Electronics Co., Ltd. (KR)

(*) Notice: Subject to any disclaimer, the term of this patent is extended or adjusted under 35 U.S.C. 154(b) by 107 days.

(21) Appl. No.: 12/381,987

(22) Filed: Mar. 18, 2009

(65) Prior Publication Data

US 2009/0258443 A1    Oct. 15, 2009

(30) Foreign Application Priority Data

Apr. 14, 2008   (KR) .................. 10-2008-0034268

(51) Int. Cl.
*H01L 21/00* (2006.01)

(52) U.S. Cl. ...... 438/3; 438/238; 438/240; 257/E21.009

(58) Field of Classification Search .............. 438/3, 240, 438/238, 785; 257/E21.009
See application file for complete search history.

(56) References Cited

U.S. PATENT DOCUMENTS

| | | | |
|---|---|---|---|
| 6,521,928 B2* | 2/2003 | Nishikawa et al. | ........... 257/295 |
| 6,951,764 B2* | 10/2005 | Andideh | ........................... 438/3 |
| 7,528,034 B2* | 5/2009 | Nakayama | .................... 438/240 |
| 2006/0145225 A1 | 7/2006 | Kohlstedt et al. | |
| 2006/0152147 A1* | 7/2006 | Lee et al. | ....................... 313/504 |
| 2006/0188697 A1* | 8/2006 | Lee | ................. 428/156 |
| 2008/0105864 A1* | 5/2008 | Park | ............................... 257/40 |

FOREIGN PATENT DOCUMENTS

| | | |
|---|---|---|
| JP | 2006-253295 | 9/2006 |
| JP | 2007-134354 | 5/2007 |
| KR | 2000-0067309 A | 11/2000 |
| KR | 10-2006-0081190 A | 7/2003 |
| KR | 10-2007-0030127 | 3/2007 |

* cited by examiner

*Primary Examiner* — Michael Trinh
(74) *Attorney, Agent, or Firm* — Mills & Onello, LLP

(57) ABSTRACT

Nonvolatile memory devices and methods of fabricating the same are provided. In some embodiments, a nonvolatile memory device includes a lower conductive member formed on an upper part of or inside a substrate, a ferroelectric organic layer formed on the lower conductive member, a protective layer formed on the ferroelectric organic layer, and an upper conductive member formed on the protective layer to cross the lower conductive member.

11 Claims, 16 Drawing Sheets

NONVOLATILE MEMORY DEVICES AND METHODS OF FABRICATING THE SAME

CROSS-REFERENCE TO RELATED APPLICATION

This application claims priority to Korean Patent Application No. 10-2008-0034268, filed on Apr. 14, 2008 in the Korean Intellectual Property Office, the disclosure of which is incorporated herein in its entirety by reference.

FIELD OF THE INVENTION

The present invention relates to nonvolatile memory devices and methods of fabricating the same, and more particularly, to those in which micro patterns can be formed by a low temperature process.

BACKGROUND

Recently, next-generation nonvolatile memory devices having good operation characteristics and improved integration of elements have become a matter of increasing concern. Research for a ferroelectric RAM (FRAM), which includes memory cells each having a pair of electrodes and a ferroelectric material interposed between the electrodes, among such next-generation nonvolatile memory devices has been actively performed.

FRAM receives an input of a signal through an adjustment of a polarization direction as an electric field is applied between a pair of electrodes, and stores digital signals "1" and "0" in accordance with the direction of residual polarization remaining after the electric field is removed. FRAM has characteristics of low power consumption, excellent durability, rapid operation speed, low driving voltage, and the like.

Generally, a pair of electrodes of an FRAM is formed by depositing a conductive material on a substrate using an evaporation method or a sputtering method.

Also, as the ferroelectric material interposed between a pair of electrodes, an inorganic material capable of exhibiting ferroelectricity, such as $PbZr_xTi_{1-x}O_3$ (PZT), $SrBi_2O_9$ (SBT), and $(Bi, La)_4Ti_3O_{12}$ (BLT), has been used.

SUMMARY OF THE INVENTION

When an inorganic material is used as the ferroelectric material, a high-temperature thermal process for forming the inorganic layer is typically used, and this can limit the selection of substrate materials. The inorganic material can be expensive, and the ferroelectric characteristic of the inorganic material may deteriorate as time lapses.

A method of using an organic material as the ferroelectric material has been studied. This method, however, can be problematic in that the organic material can be vulnerable to heat, and thus it can be difficult to use evaporation, sputtering, and the like, to form the electrodes.

In addition, an inkjet method, a screen printing method, and the like, have been proposed to form electrode patterns. However, these methods can be limited when it comes to forming micro electrode patterns and a process time, and the manufacturing costs can be high.

Accordingly, there is a need for a nonvolatile memory device in which micro electrode patterns can be formed with a high yield and that has reduced manufacturing cost and process time.

In one aspect, the present invention provides nonvolatile memory devices in which micro electrode patterns are formed with high yield and which have reduced manufacturing cost and process time.

In another aspect, the present invention provides methods of fabricating a nonvolatile memory devices in which micro electrode patterns are formed with high yield and which have reduced manufacturing cost and process time.

Additional aspects, advantages, and features of the invention will be set forth in part in the description which follows and in part will become apparent to those having ordinary skill in the art upon examination of the following.

In another aspect, the invention provides a nonvolatile memory device including a lower conductive member formed on an upper part of or inside a substrate; a ferroelectric organic layer formed on the lower conductive member; a protective layer formed on the ferroelectric organic layer; and an upper conductive member formed on the protective layer to cross the lower conductive member.

In another aspect, the invention-provides a method of fabricating a nonvolatile memory device including forming a lower conductive member on an upper part of or inside a substrate; forming a ferroelectric organic layer on the lower conductive member; and forming an upper conductive member on the protective layer to cross the lower conductive member; wherein at least one of the forming of the lower conductive member, the forming of the ferroelectric organic layer, and the forming of the upper conductive member is performed using a nano-transfer printing method.

In still another aspect, the invention provides a method of fabricating a nonvolatile memory device including forming a lower electrode formed in a first direction on a substrate; forming a ferroelectric organic layer including a polymer material on the lower electrode; forming a protective layer including a polymer material having a glass transition temperature lower than that of the ferroelectric organic layer on the ferroelectric organic layer; and forming an upper electrode formed in a second direction on the protective layer to cross the lower electrode; wherein the forming of the lower electrode and the upper electrode is performed using a nano-transfer printing method.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE PREFERRED EMBODIMENTS

Figure 1:
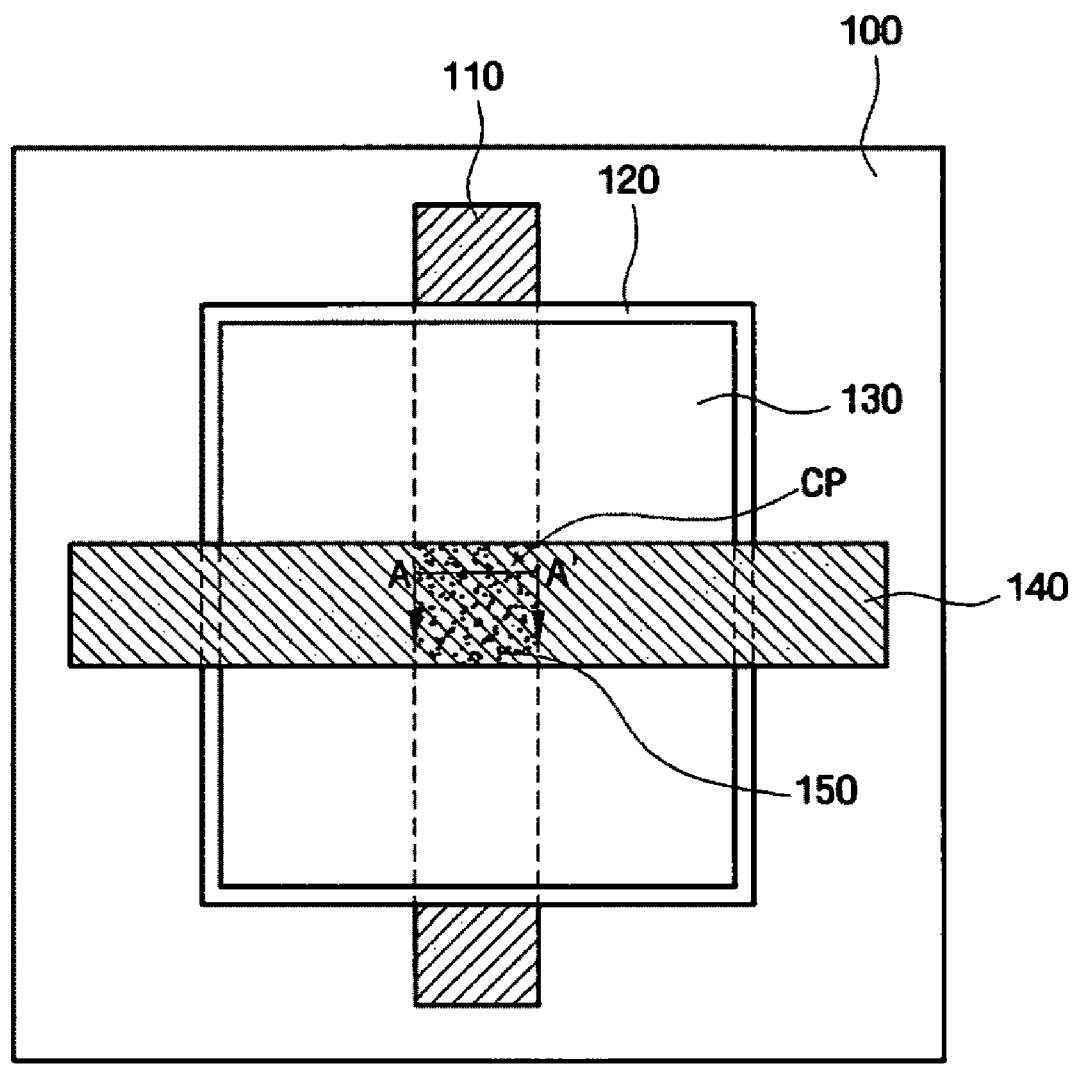
FIG. 1 is a layout view of a nonvolatile memory device according to a first embodiment of the present invention.

Hereinafter, preferred embodiments of the present invention will be described in detail with reference to the accompanying drawings. The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined by the appended claims. In the description, the same drawing reference numerals are used for the same elements across various figures.

The term "connected to" or "coupled to" that is used to designate a connection or coupling of one element to another element includes both a case in which an element is "directly connected" or "directly coupled to" another element and a case in which an element is connected or coupled to another element via still another element. The term "directly connected to" or "directly coupled to" means that an element is connected or coupled to another element without intervention of any other element. Also, the term "and/or" includes the described items and combinations thereof.

Although the terms "first", "second", and so forth are used to describe diverse elements, components and/or sections, such elements, components and/or sections are not limited by the terms. The terms are used only to discriminate an element, component, or section from other elements, components, or sections. Accordingly, in the following description, a first element, first component, or first section may be a second element, second component, or second section.

In the following description, the terms used are for explaining embodiments of the present invention, but do not limit the scope of the present invention. In the description, a singular expression may include a plural expression unless specially described. The terms "comprises" and "made of" used in the description mean that one or more other components, steps, operation and/or elements are not excluded from the described components, steps, operation and/or elements.

Unless specially defined, all terms (including technical and scientific terms) used in the description have meanings commonly understood by those of ordinary skilled in the art to which the present invention belongs. In addition, terms that are generally used but are not defined in the dictionary are not interpreted ideally or excessively unless they have been clearly and specially defined.

Figure 2:
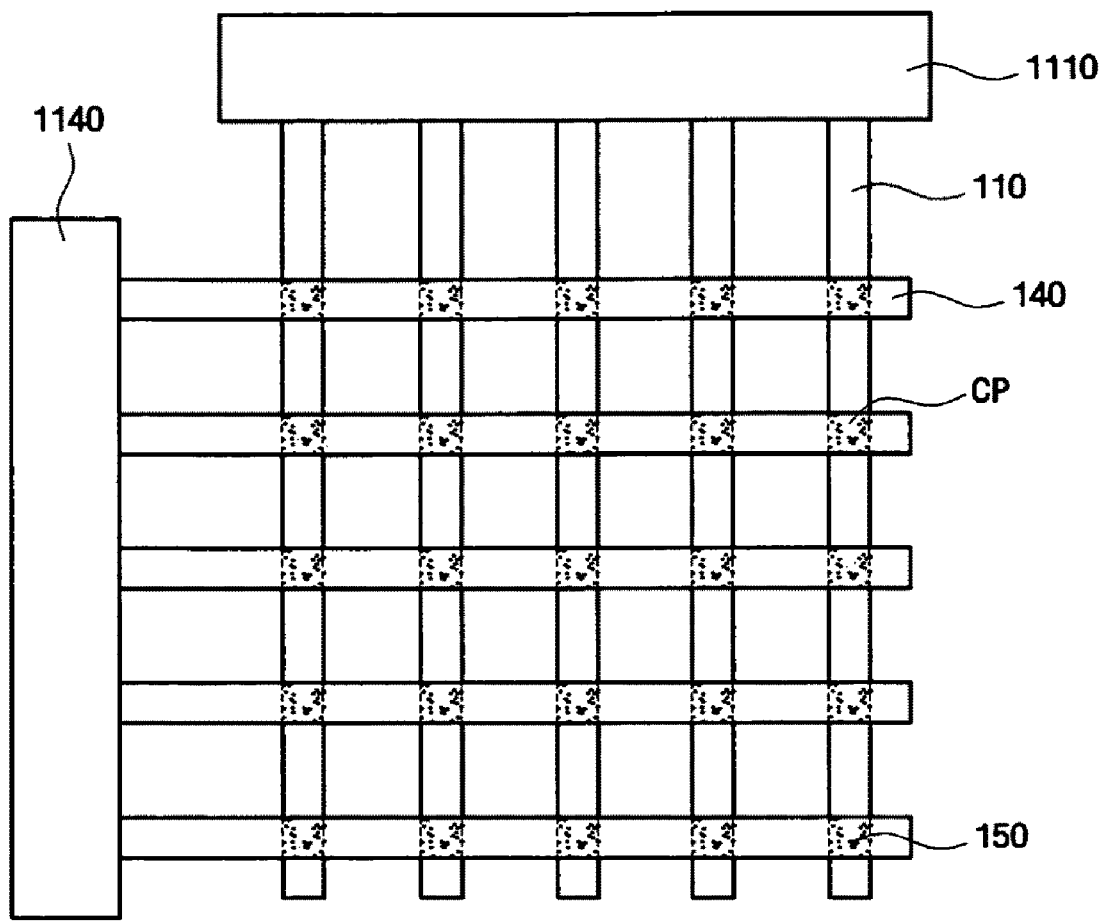
FIG. 2 is a layout view of a memory array of the nonvolatile memory device according to the first embodiment of the present invention.
Figure 3:
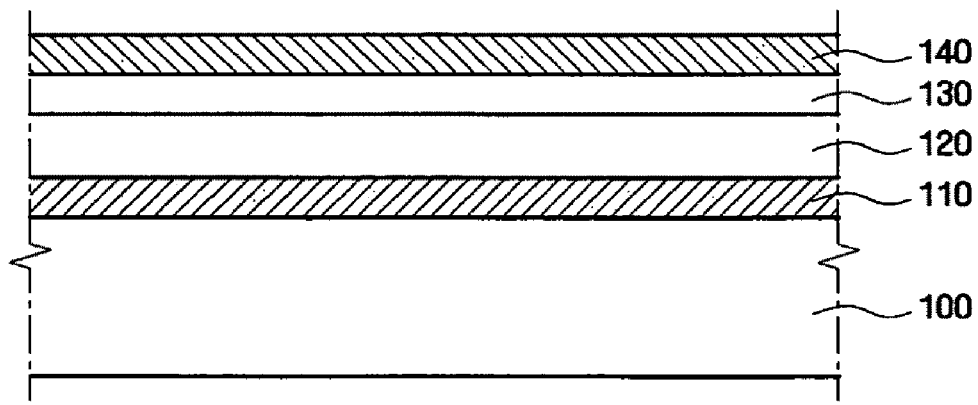
FIG. 3 is a section view of a nonvolatile memory device according to the first embodiment of the present invention, taken along line A-A' of FIG. 1.

Hereinafter, a nonvolatile memory device according to a first embodiment of the present invention will be described with reference to FIGS. 1 to 3. FIG. 1 is a layout view of a nonvolatile memory device according to the first embodiment of the present invention, and FIG. 2 is a layout view of a memory array of the nonvolatile memory device according to the first embodiment of the present invention. FIG. 3 is a section view of a nonvolatile memory device according to the first embodiment of the present invention, taken along line A-A' of FIG. 1.

Referring to FIGS. 1 to 3, a lower conductive member 110 is formed on a substrate 100 of a nonvolatile memory device according to an embodiment of the present invention.

The substrate 100 may be a silicon substrate, an SIO (Silicon On Insulator) substrate, a gallium arsenide substrate, a silicon germanium substrate, a ceramic substrate, a quartz substrate, a glass substrate for display, or a rigid or flexible plastic substrate made of polyimide, PET (polyethyleneterephthalate), PEN (polyethylenenaphthalate), PMMA (polymethylmethacrylate), PC (polycarbonate), PES (polyethersulfone), polyester, or the like.

As shown, the lower conductive member 110 is formed in a first direction, and in linear patterns.

The lower conductive member 110 can be made of a metal, such as Au, Ag, Cu, Al, Ti, Ta, W, Ir, Pt, Pd, Ru, Zr, Rh, Ni, Co, Cr, Sn, Zn, Li, Mg, and Ca, metal oxides and alloys thereof, TiN, TiAlN, TaN, WN, ITO, ZnO, or a conductive inorganic material, such as polysilicon and so on. Also, the lower conductive member 110 may be made of a carbon-based material, such as carbon black, carbon nanotubes, fullerenes, or the like, or a conductive organic material including a conductive polymer material, such as polyacetylenes, polypyrroles, polythiophenes such as PEDOT (poly-ethylenedioxythiophene) doped with PSS (polystyrene sulfonate), polyanilines, poly(p-phenylenes), polyfluorines, polycarbazols, polysilanes, or derivatives thereof.

The lower conductive member 110 functions as a lower electrode of the nonvolatile memory device according to embodiments of the present invention. In embodiments of the present invention, the lower conductive member 110 has a line width of approximately 10 nm—approximately 100 μm, and particularly, a micro line width of approximately 10 approximately 100 nm, so that a high integration of memory cells may be possible.

On an upper part of the lower conductive member 110, a ferroelectric organic layer 120 is formed. As shown, the ferroelectric organic layer 120 is patterned to be interposed at a cross point (CP) where the lower conductive member 110 and an upper conductive member 140 cross each other, or the ferroelectric organic layer 120 can be formed on the whole surface of the substrate 100.

In embodiments of the present invention, the ferroelectric organic layer 120 has a dipole moment and thus is made of a polymer material exhibiting a hysteresis characteristic. However, as long as the ferroelectric organic layer 120 has a dipole moment, it is not excluded that it is made of small molecule materials or oligomers.

The ferroelectric organic layer 120 can be made, for example, of at least one material selected from a group consisting of PVDF (polyvinylidenedifluorides), copolymers of P(VDF/TrFE) (poly(vinylidenedifluoride/trifluoroethylenes), vinylidene oligomers, odd-numbered nylons, such as nylon 7 or nylon 11, polyamides, polyureas, and poly(vinylidene cyanide) copolymers.

The glass transition temperature Tg of the ferroelectric organic layer 120 can be in the range of approximately 110—approximately 150° C.

The ferroelectric organic layer 120 can be formed with a thickness of approximately 10 nm—approximately 10 µm. If the thickness of the ferroelectric organic layer 120 is below approximately 10 nm, a leakage current can be generated between an upper conductive member 140 to be described later and the lower conductive member 110. If the thickness of the ferroelectric organic layer 120 exceeds approximately 10 µm, a voltage for driving memory cells can be heightened, and thus it can be difficult for the nonvolatile memory to operate.

On an upper part of the ferroelectric organic layer 120, a protective layer 130 is formed. Although FIG. 1 illustrates the protective layer 130 having a size smaller than the ferroelectric organic layer 120, the protective layer 130 can be patterned to cover the whole ferroelectric organic layer 120 or can be formed on the whole surface of the substrate 100.

The protective layer 130 serves to prevent damage to the ferroelectric organic layer 120 and to stabilize the operation characteristics of the memory cells.

In some embodiments, the protective layer 130 is made of a polymer material having a glass transition temperature lower than the ferroelectric organic layer 120. Accordingly, the upper conductive member 140 to be described later can be formed by a low-temperature process, and the pattern forming yield of the upper conductive member 140 is improved.

The protective layer 130 can be made of an insulating material, a conductive material, or a semiconductor material. Once the protective layer 130 is made of a material having a glass transition temperature that is lower than that of the ferroelectric organic layer 120, its electrical characteristics are not limited.

The protective layer 130 can be made of a polymer material selected from a group consisting of PMMA (polymethylmethacrylates), PS (polystyrenes), PC (polycarbonates), polyesters, polyamides, polyimides, polyurethanes, polyacetals, polysilicons, polysulfonates, novolak, polyacetates, polyalkyds, polyamideimides, polysiloxanes, polyarylates, polyarylsulfones, polyethersulfones, polyphenylene sulfides, polyvinyl chlorides, polysulfones, polyetherimides, polytetrafluoroethylene, polychlorotri-fluoroethylenes, polyether ketones, poly(etheretherketones), polybenzoxazoles, PPV (poly(phenylene vinylene)), PF (polyfluorenes), PT (polythiophenes), PPP (poly(paraphenylenes)), PVK (polyvinylcarbazoles), derivatives thereof, and copolymers thereof. However, it is not excluded that the protective layer 130 is made of small molecule materials or oligomers.

The protective layer 130 can be formed with a thickness of approximately 5 nm—approximately 5 µm. If the thickness of the protective layer 130 is smaller than approximately 5 nm, it can be difficult to prevent the damage to the ferroelectric organic layer 120, and if the thickness of the protective layer 130 is larger than 5 µm, the ferroelectric characteristics of the ferroelectric organic layer 120 may be lost.

The upper conductive member 140 is formed, for example, in a second direction on the protective layer 130 to cross the lower conductive member 110. As shown, the second direction is a direction perpendicular to the first direction.

The upper conductive member 140 functions as an upper electrode, and can be made of the same material as the lower conductive member 110. The upper conductive member 140 can also be formed as linear patterns having the same line width as the lower conductive member 110.

At a cross point where the upper conductive member 140 and the lower conductive member 110 cross each other, the ferroelectric organic layer 120 is interposed to provide a dielectric forming region 150.

Referring to FIG. 2, the lower conductive member 110 is composed of a plurality of linear patterns formed in the first direction, and the upper conductive member 140 is composed of a plurality of linear patterns formed in the second direction.

The plurality of lower conductive members 110 are connected to a lower conductive member control circuit 1110, and the lower conductive member control circuit 1110 selects one among the plurality of lower conductive members 110.

The plurality of upper conductive members 140 are connected to an upper conductive member control circuit 1140, and the upper conductive member control circuit 1140 selects one among the plurality of upper conductive members 140, and applies a specified voltage to the selected upper conductive member 140.

The upper conductive member 140 may be protected by a separate insulating layer (not illustrated) formed on the upper part thereof, and external metal interconnection lines (not illustrated) may be additionally formed as needed.

Data write is performed by a manner in which a plurality of upper conductive members 140 and lower conductive members 110 are selected, the selected lower conductive members 110 are grounded, and a voltage, which is lower than a write voltage, is applied to the selected upper conductive members 140.

Data write in a nonvolatile memory according to embodiments of the present invention is performed by a manner in which a plurality of upper conductive members 140 and lower conductive members 110 are selected, the selected lower conductive members 110 are grounded, and a voltage, which is lower than a write voltage, is applied to the selected upper conductive members 140.

Data erase is performed by a manner in which a plurality of upper conductive members 140 and lower conductive members 110 are selected, the selected lower conductive members 110 are grounded, and a voltage, which is higher than an erase voltage, is applied to the selected upper conductive members 140.

Hereinafter, with reference to FIGS. 4A to 8, a method of fabricating a nonvolatile memory device according to an embodiment of the present invention will be described in detail.

First, with reference to FIGS. 4A to 4D, a method of manufacturing a transfer mold used in the first embodiment of the present invention will be described. FIGS. 4A to 4D are sectional views illustrating a method of manufacturing a transfer mold by processes for use in the fabrication of a nonvolatile memory device according to embodiments of the present invention.

Figure 4A:
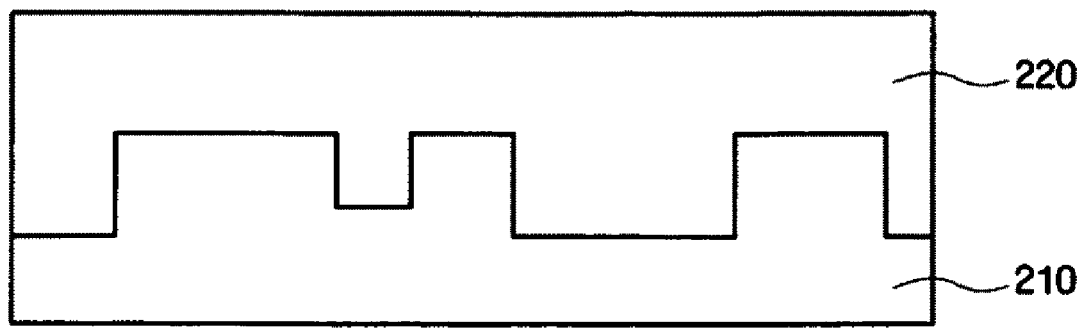
FIGS. 4A to 4D are sectional views illustrating a method of manufacturing a transfer mold by processes for use in the fabrication of a nonvolatile memory device according to the first embodiment of the present invention.

Referring to FIG. 4A, patterns of a specified lower conductive member (See 110 in FIG. 8) or upper conductive member (See 140 in FIG. 8) are formed on a master mold 210. This master mold 210, for example, can be made of a silicon material. The patterns of the lower and upper conductive members can be formed by a manner in which the master mold 210 is coated with a photosensitive polymer, and the photosensitive polymer can be patterned by a photolithography process, and then the silicon material is etched.

Then, a preliminary mold 220 is formed using the master mold 210 as a mold. For example, the preliminary mold 220 can be obtained by hardening a polymer melt that forms the preliminary mold 220 on the master mold 210. As the preliminary mold 220, for example, PDMS (polydimethylsiloxane) may be used.

Figure 4B:
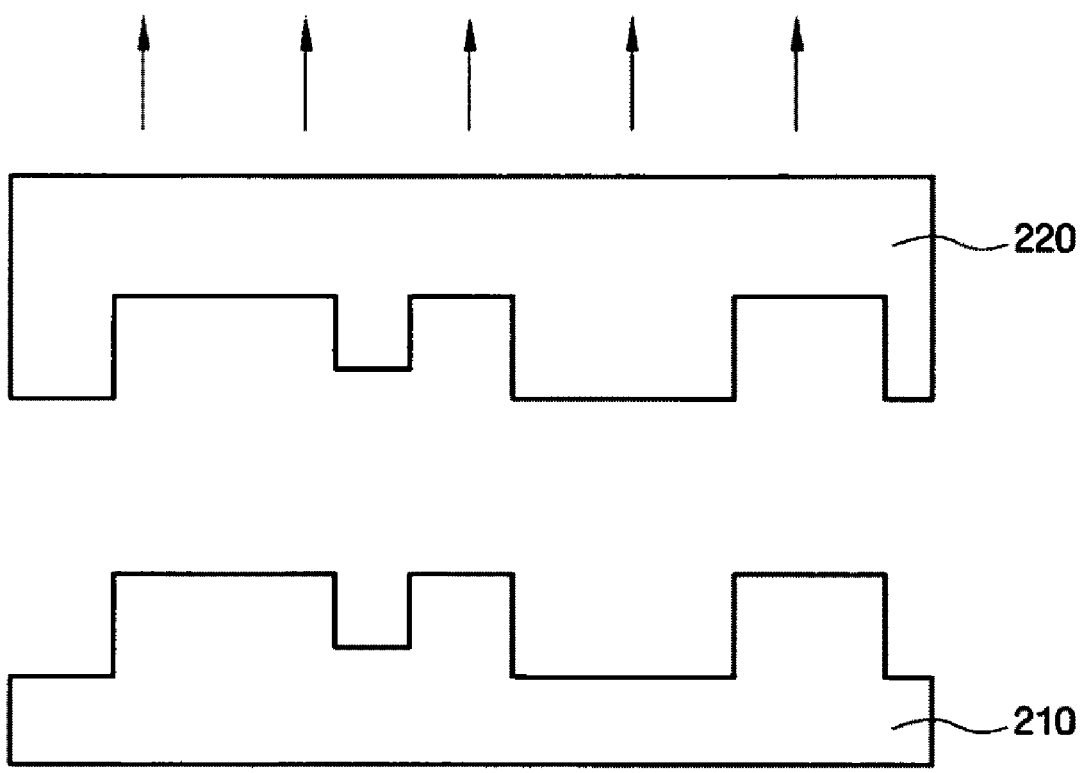

Referring to FIG. 4B, after the preliminary mold 220 has hardened, it is separated from the master mold 210.

Figure 4C:
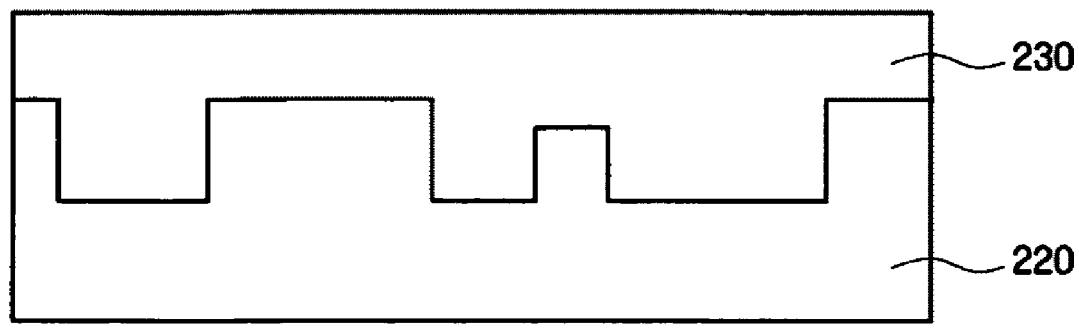

Referring to FIG. 4C, a transfer mold 230 is formed, for example, by hardening the polymer melt on the preliminary mold 220. The transfer mold 230, for example, may be made of the same material as the preliminary mold 220.

Figure 4D:
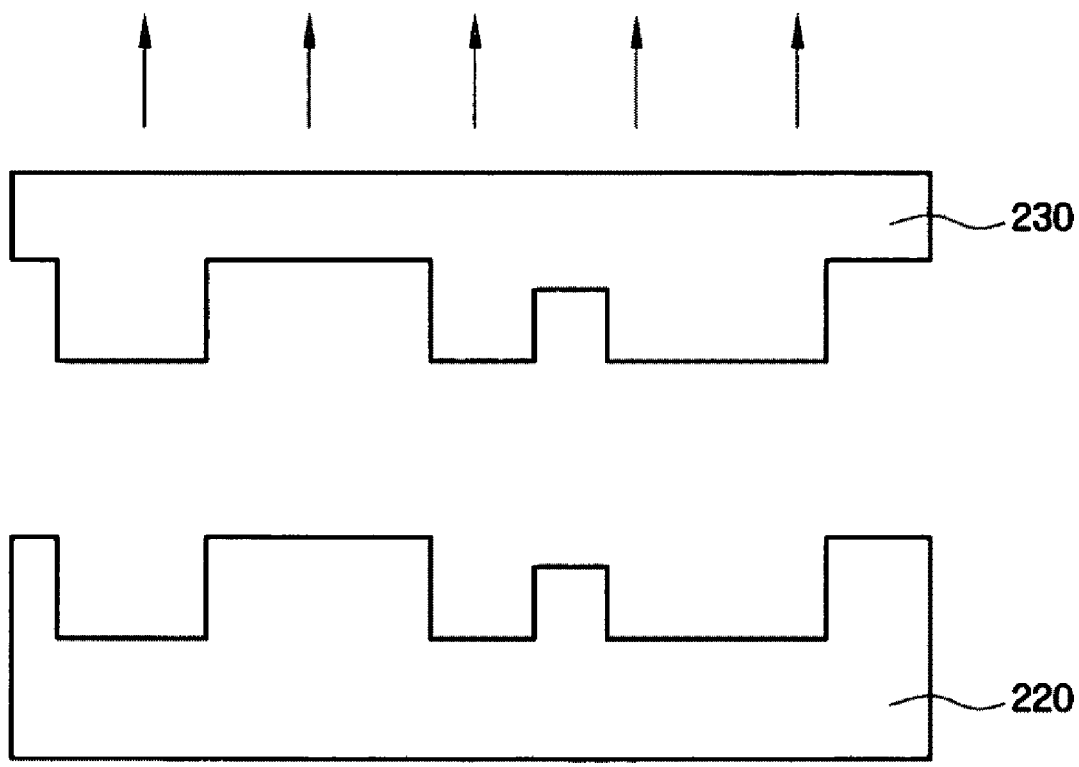

Referring to FIG. 4D, the transfer mold 230 is then separated from the preliminary mold 220. On the transfer mold 230, patterns of the lower and upper conductive members are formed.

Figure 5A:
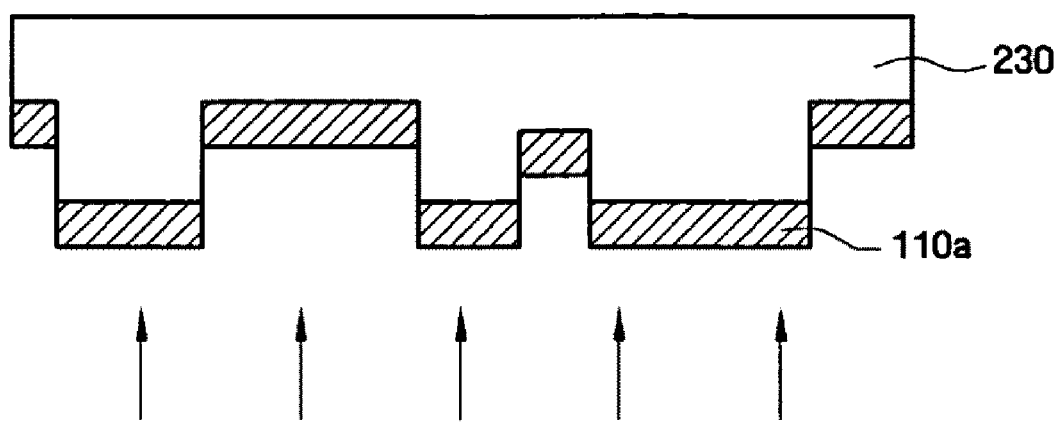
FIGS. 5A to 5C are sectional views illustrating a method of forming electrode patterns by processes for use in the fabrication of a nonvolatile memory device according to the first embodiment of the present invention.
Figure 5B:
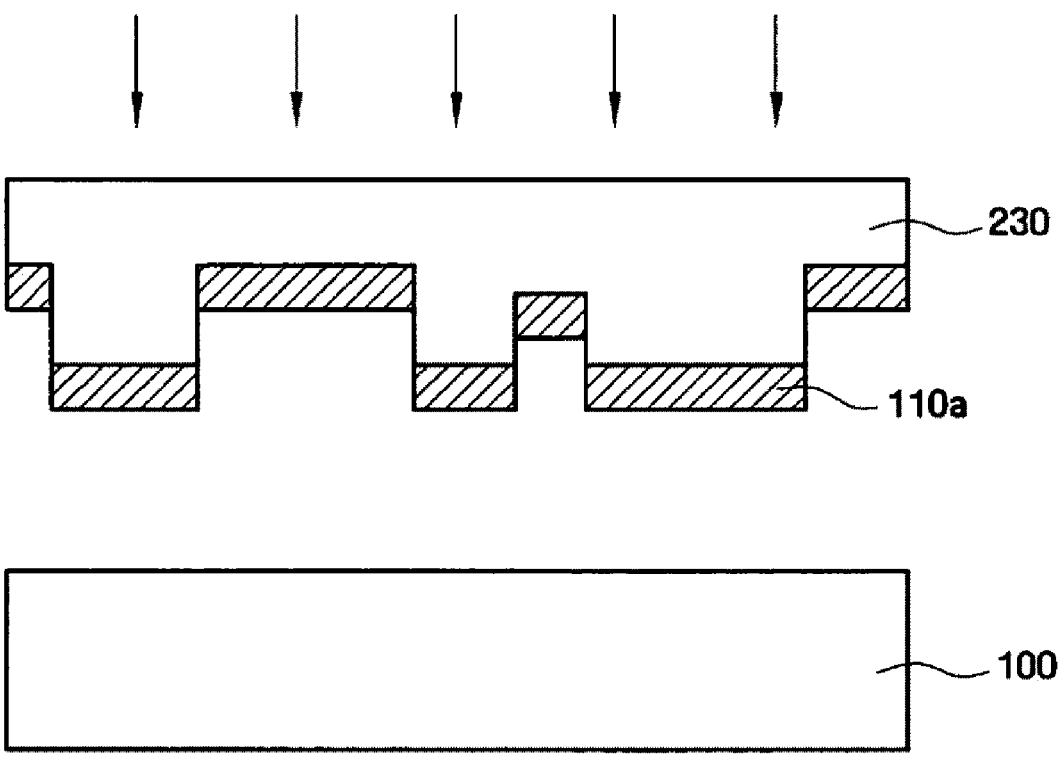
Figure 5C:
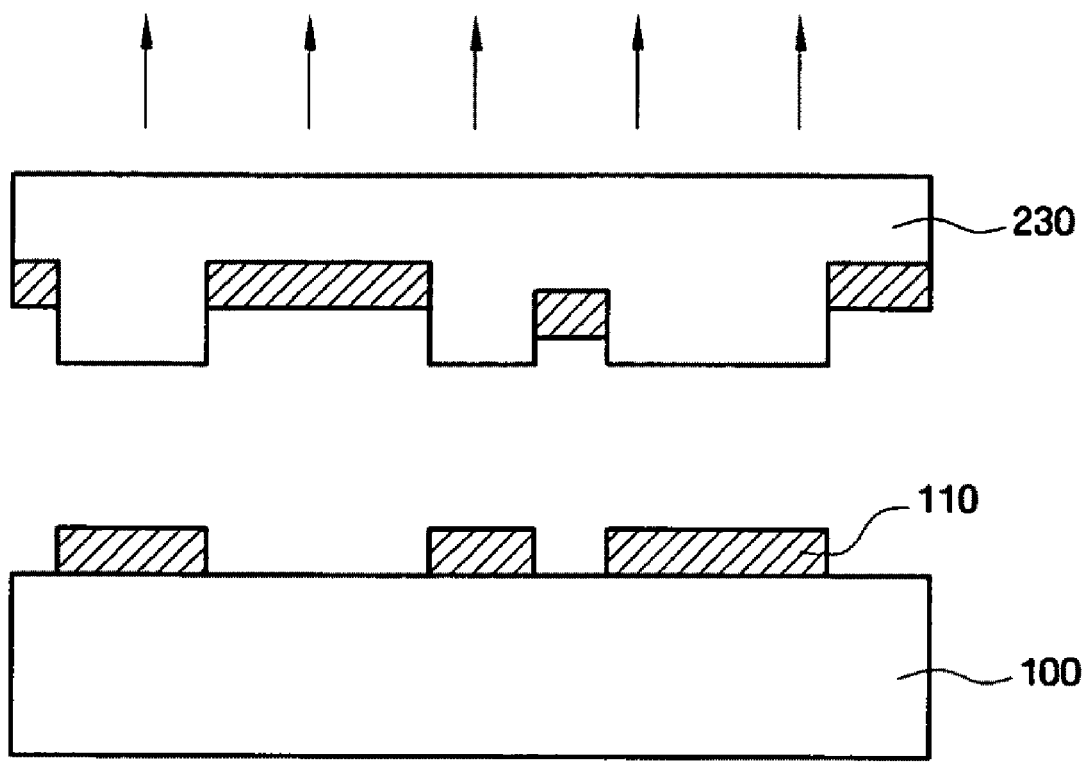

Hereinafter, with reference to FIGS. 5A to 5C, a method of forming patterns of the lower and upper conductive members of the nonvolatile memory device according to embodiments of the present invention will be described in detail. FIGS. 5A to 5C are sectional views illustrating a method of forming electrode patterns of the nonvolatile memory device according to embodiments of the present invention.

Referring to FIG. 5A, lower or upper electrode patterns are formed by depositing a conductive material for forming the lower or upper electrode on the transfer mold 230 having the patterns of the lower and upper conductive members provided through the above-described process by an evaporation method or a sputtering method, or by performing an inkjet of a dispersion including the conductive material for forming the lower or upper electrode or a solution including the conductive material. For example, patterns are formed by performing an inkjet of a dispersion including nano-particles of the conductive material for forming the lower or upper electrode or a solution including precursors of the nano-particles, or by applying an organic metal complex solution or a PEDOT/PSS (poly(3,4-ethylene dioxythiophene)/(poly(styrenesulfonate solution)) solution on the transfer mold, and then heating the resulting product.

As described above, the lower and upper electrode patterns are transferred onto the transfer mold 230. However, patterns of a ferroelectric organic layer may also be formed on the transfer mold 230.

Referring to FIG. 5B, the transfer mold 230 is put on the substrate 100 or a protective layer (See 130 in FIG. 8), which has been heated at a specified temperature, and uniform pressure is applied onto the whole surface of the transfer mold 230. In some embodiments, the heating temperature of the substrate 100 is higher than the melting temperature of the substrate or the glass transition temperature of the protective layer. The applied pressure can be in the range of approximately 3—approximately 10 gf/cm². Then, the substrate 100 is cooled to form the lower and upper electrode patterns.

Referring to FIG. 5C, the transfer mold 230 is removed from the substrate 100. On the substrate 100 or the protective layer, the lower or upper electrode 100 or 140 is formed. As described above, a process of forming the lower or upper electrode 110 or 140 on the substrate 100 and so on at a low temperature using the transfer mold 230 is called a nano-transfer printing method. Also, by using the transfer mold 230 formed of patterns made of ferroelectric organic matter, instead of a conductive material for forming the lower or upper electrode, even the ferroelectric organic layer (not illustrated) can be formed by the nano-transfer printing method.

Figure 6:
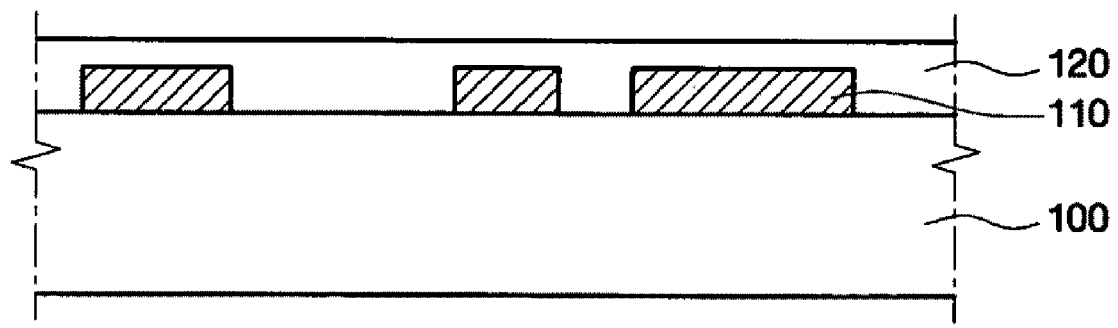
FIGS. 6 to 8 are sectional views illustrating a method of fabricating a nonvolatile memory device according to the first embodiment of the present invention.
Figure 7:
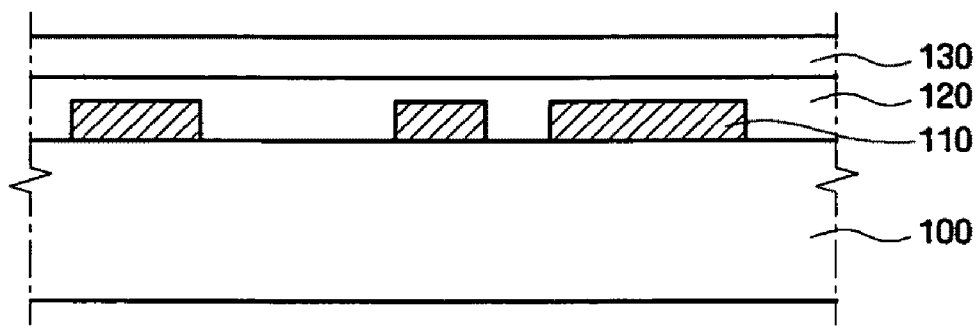
Figure 8:
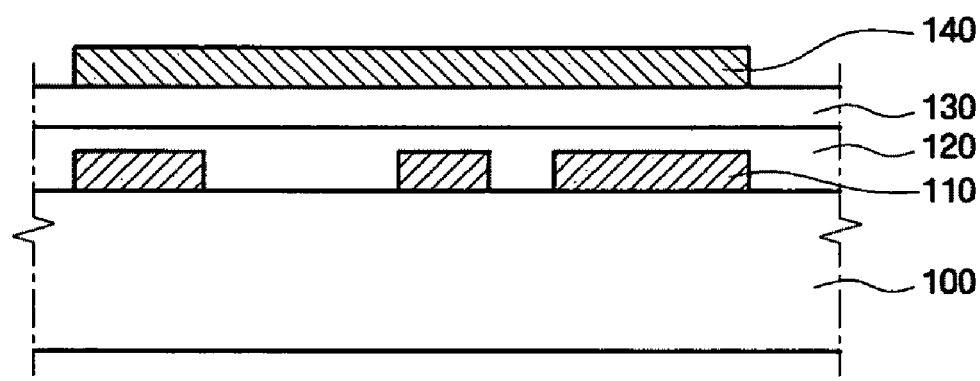

Hereinafter, with reference to FIGS. 6 to 8, a method of fabricating a nonvolatile memory device according to embodiments of the present invention will be described in detail. FIGS. 6 to 8 are sectional views illustrating a method of fabricating a nonvolatile memory device according to embodiments of the present invention.

Referring to FIG. 6, a lower conductive member 110 is formed to extend in a first direction on a substrate 100. The lower conductive member 110 may be a lower electrode, and the lower electrode may be formed as patterns made of a conductive material using the nano-transfer printing method or using an evaporation method, sputtering or a CVD method.

Then, a ferroelectric organic layer 120 is formed on the whole surface of the substrate 100. The ferroelectric organic layer 120, for example, may be made of an organic polymer material such as P(VDF/FrFE). Specifically, P(VDF/TrFE) is dissolved in MEK (methylethylketone) solvent, the resulting solution is spin-coated on the whole surface of the substrate 100, and then the remaining solvent is removed. The ferroelectric organic layer 120 can be formed by aligning the molecular orientation through repetition of heating and cooling. In other embodiments, the ferroelectric organic layer 120 may also be formed by forming patterns made of a ferroelectric organic matter using the nano-transfer printing method.

Then, referring to FIG. 7, a protective layer 130 is formed on the ferroelectric organic layer 120. The protective layer 130 may be made of a polymer material having a glass transition temperature lower than that of the ferroelectric organic layer 120. The protective layer 130 can be formed, for example, using PMMA, and specifically, the protective layer can be formed by dissolving PMMA in an anisole solvent, spin-coating the resulting solution on the substrate, and then removing the solvent.

In some embodiments of forming the upper conductive member 140 on the ferroelectric organic layer 120, a process of forming the protective layer 130 may not be performed.

Then, referring to FIG. 8, the upper conductive member 140 arranged in the second direction is formed using the nano-transfer printing method. In certain embodiments of the present invention, the upper conductive member 140 may be an upper electrode.

More specifically, the substrate 100 is heated at a temperature higher than the glass transition temperature of the protective layer 130, and patterns of the upper conductive member 140 are transferred onto the protective layer 130 by pressing the transfer mold (See 230 in FIG. 5C), on which the patterns of the upper conductive member 140 are formed, onto the protective layer 130. In some embodiments, the heating temperature of the substrate 100 may be lower than the glass transition temperature of the ferroelectric organic layer 120. Since the glass transition temperature of the protective layer 130 may be lower than that of the ferroelectric organic layer 120, the process temperature can be lowered during the forming of the upper conductive member 140.

In addition, since a device for performing the nano-transfer printing method is simplified and its process time is shortened, the fabricating cost and process time of the nonvolatile memory device can be reduced, and the electrodes can be formed with a micro line width. Also, by providing the protective layer 130 on the ferroelectric organic layer 120, damage to the ferroelectric organic layer 120 can be reduced during the forming of the upper conductive member 140.

However, it is not excluded that the upper conductive member 140 is directly formed on the ferroelectric organic layer 120. That is, in some embodiments of the present invention, the substrate 100 is heated at a temperature higher than the glass transition temperature of the ferroelectric organic layer 120, and the patterns of the upper conductive member 140 are transferred onto the ferroelectric organic layer 120 by pressing the transfer mold, on which the patterns of the upper conductive member 140 are formed, onto the ferroelectric organic layer 120.

Figure 9:
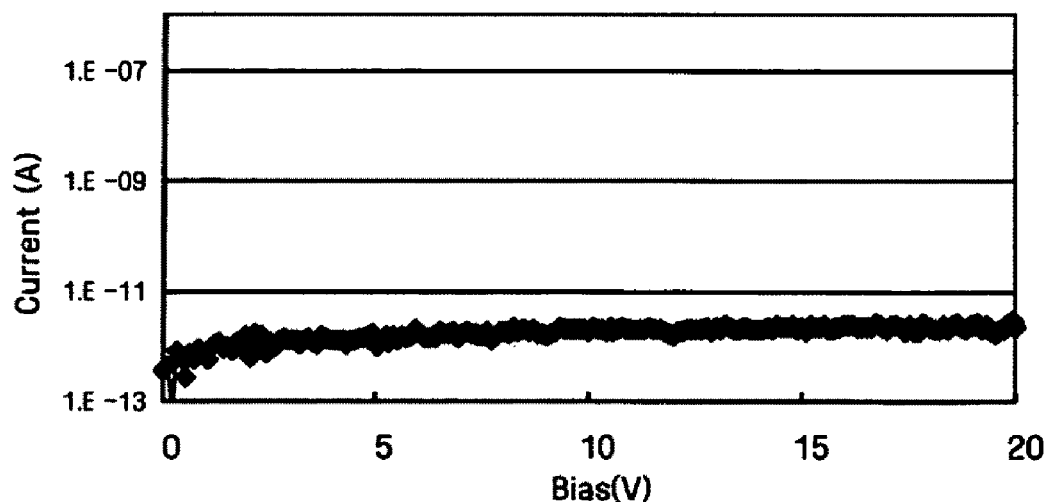
FIG. 9 is a graph illustrating the current-voltage characteristic of a nonvolatile memory device fabricated by the method according to the first embodiment of the present invention.
Figure 10:
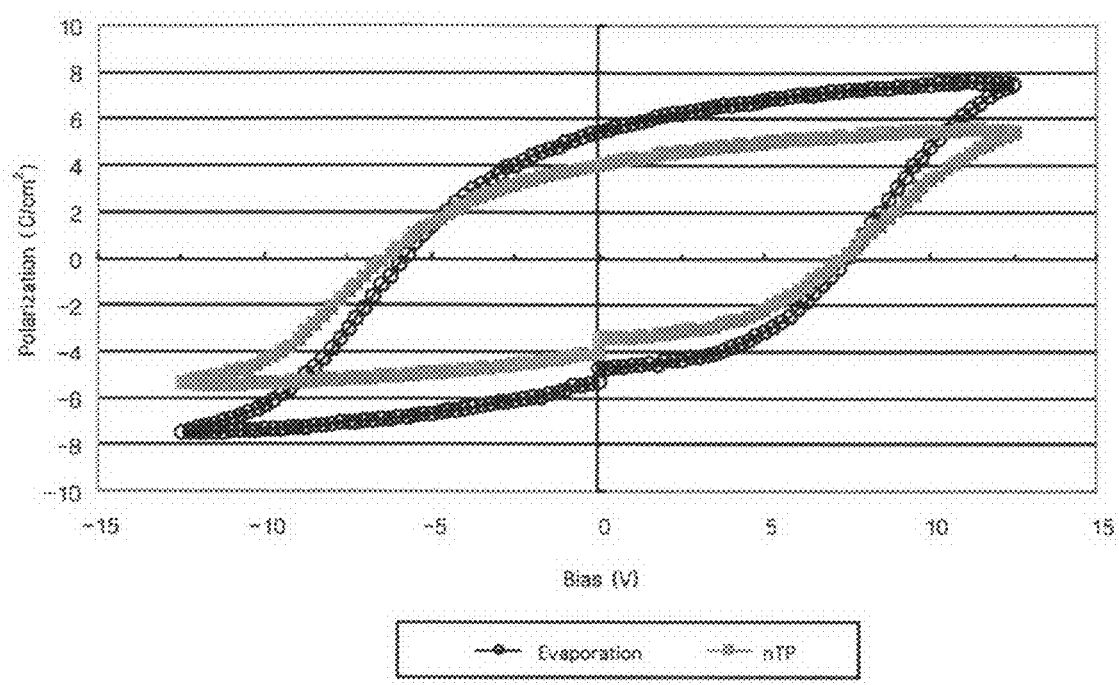
FIG. 10 is a graph for comparison of the hysteresis curves of a nonvolatile memory device fabricated by the method according to the first embodiment of the present invention and a nonvolatile memory device fabricated by another method.

Hereinafter, with reference to experimental examples and FIGS. 9 to 12B, the characteristics of the nonvolatile memory device according to some embodiments of the present invention will be examined. FIG. 9 is a graph illustrating the current-voltage characteristic of a nonvolatile memory device fabricated by the method according to a first embodiment of the present invention. FIG. 10 is a graph for comparison of the hysteresis curves of a nonvolatile memory device fabricated by the method according to the first embodiment of the present invention and a nonvolatile memory device fabricated by another method. FIGS. 11A to 12B are photos for comparison of the shapes of electrode patterns of a nonvolatile memory device fabricated by the method according to the first embodiment of the present invention and a nonvolatile memory device fabricated by another method.

Experimental Examples

Substrate Manufacture

A lower electrode was formed with a thickness of approximately 1000 Å on the whole surface of a silicon substrate, on which a silicon oxide layer is formed with a thickness of approximately 1000 Å, by sputtering aluminum thereon. On an upper part of the lower electrode, a solution (2.0%), which was obtained by dissolving P(VDF-TrFE) in MEK (methylethylketone) solvent, was spin-coated at approximately 1500 rpm. Then, the remaining solvent was removed, and in order to align the molecular orientation, the resulting product was heated at approximately 140° C. for one hour, and then cooled at room temperature to form a ferroelectric organic layer. A solution (0.2%), which was obtained by dissolving PMMA in anisole solvent, was spin-coated on the ferroelectric organic layer at approximately 4500 rpm. In order to remove the remaining solvent, the resulting product was heated at approximately 100° C. for approximately 10 minutes to form a protective layer.

Transfer Mold Manufacture

A master mold was provided by forming upper electrode patterns on a silicon wafer by a photolithography process. Using the master mold as a mold, a PDMS preliminary mold was obtained by hardening PDMS on the master mold. The master mold can be repeatedly used. A PDMS transfer mold, into which the electrode patterns were copied, was formed by hardening PDMS using the PDMS preliminary mold. An aluminum film was formed on the transfer mold with a thickness of approximately 500 Å by evaporating aluminum on the transfer mold.

Upper Electrode Formation by Nano-Transfer Printing Method

The manufactured substrate was heated over the glass transition temperature (115° C.) of PMMA that is the protective layer, and was maintained at the temperature for approximately 10 minutes. The transfer mold, on which aluminum was deposited, was arranged on the substrate so that aluminum was in contact with PMMA, a pressure of approximately 5 gf/cm$^2$ was uniformly applied to the whole transfer mold, and this pressure was maintained for three minutes. Then, the substrate was cooled to approximately 60° C., and the transfer mold was removed from the substrate. On the surface of the substrate, the transferred aluminum upper electrode was formed.

Referring to FIG. 9, the current-voltage characteristic of a nonvolatile memory device, in which the ferroelectric organic layer and the protective layer are interposed between both electrodes made of aluminum, according to the embodiment of the present invention can be confirmed. As a result of checking the I-V characteristic, it can be confirmed that almost no leakage current is generated between the upper and lower electrodes.

Referring to FIG. 10, it can be confirmed that the hysteresis curve in the case of forming the upper electrode through the nano-transfer printing method is similar to the hysteresis curve in the case of forming the upper electrode through an evaporation method.

Figure 11A:
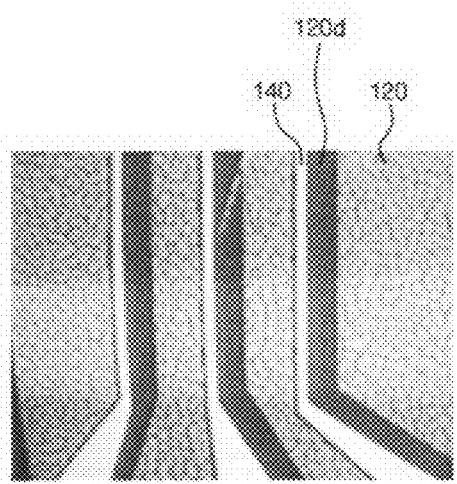
FIGS. 11A to 12B are photos for comparison of the shapes of electrode patterns of a nonvolatile memory device fabricated by the method according to the first embodiment of the present invention and a nonvolatile memory device fabricated by another method.
Figure 11B:
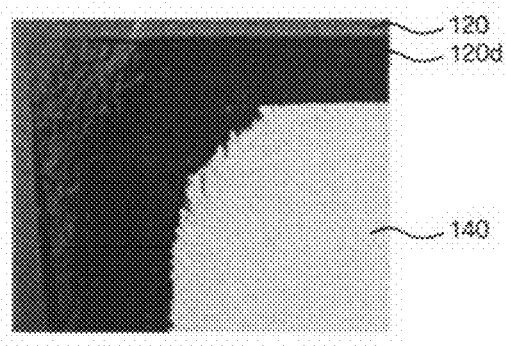

Referring to FIGS. 11A to 11B, in the case where the upper conductive member 140 is nano-transfer-printed on the ferroelectric organic layer 120, without forming the protective layer (not illustrated), a damaged portion 120d of the ferroelectric organic layer 120 occurs, and this causes the leakage current to increase, or causes an electric short to occur between the upper and lower electrodes.

Figure 12A:
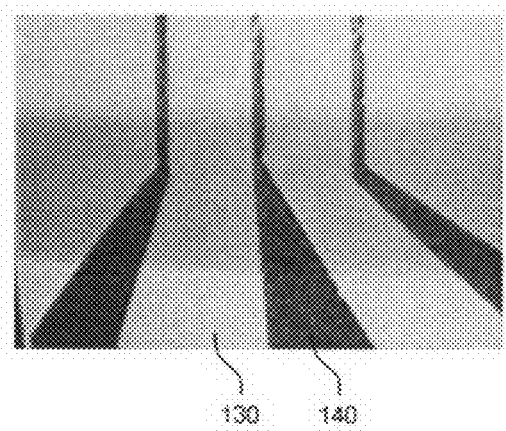
Figure 12B:
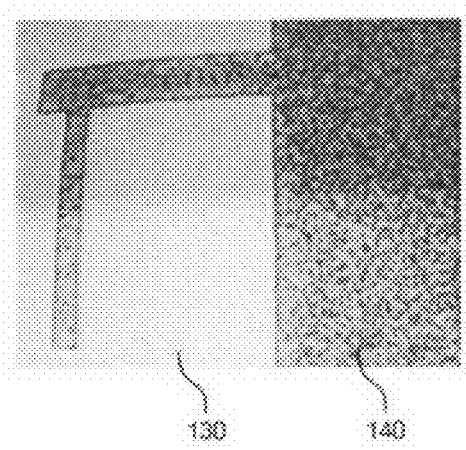

In contrast, referring to FIGS. 12A and 12B, in the case where the protective layer 130 is formed on the ferroelectric organic layer (not illustrated), and then the upper conductive member 140 is nano-transfer-printed thereon, the ferroelectric organic layer or the protective layer 130 is not damaged, and accurate upper electrode patterns are formed.

Figure 13:
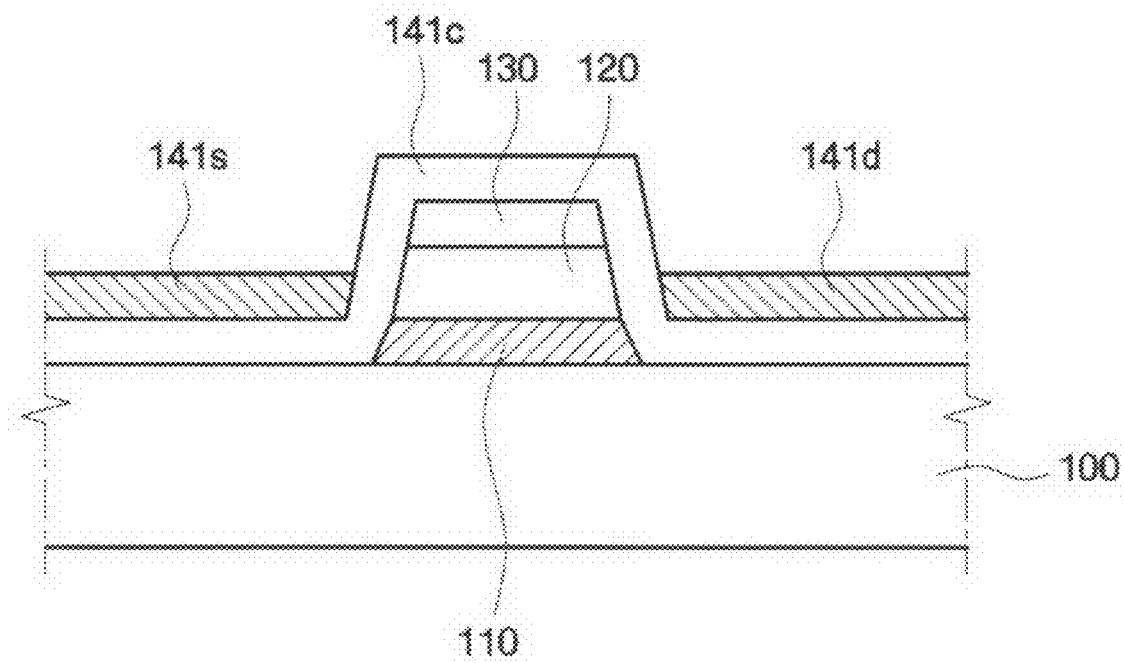
FIG. 13 is a sectional view of a nonvolatile memory device according to a second embodiment of the present invention.

Hereinafter, with reference to FIG. 13, a nonvolatile memory device according to a second embodiment of the present invention will be described in detail. FIG. 13 is a sectional view of a nonvolatile memory device according to the second embodiment of the present invention. In the following embodiments of the present invention, the description of the same constituent elements as those in the previous embodiment of the present invention will be omitted or simplified.

Referring to FIG. 13, a lower conductive member 110 according to the embodiment of the present invention may be a lower electrode, and the lower electrode can serve as a gate electrode. A channel pattern 141c is formed on a ferroelectric organic layer 120. The channel pattern 141c is formed on an insulating layer, which is formed of an organic material or an inorganic material such as silicon on the whole surface of a substrate 100 on which the ferroelectric organic layer 120 is formed. The channel pattern 141c may be formed only on a portion overlapping the ferroelectric organic layer 120.

A source electrode 141s and a drain electrode 141d are arranged apart from each other, and are connected to the channel pattern 141c. The source electrode 141s and the drain electrode 141d according to the second embodiment of the present invention are formed of the same material as the upper conductive member in the previous embodiment of the present invention through a nano-transfer printing method.

In the second embodiment of the present invention, the source electrode 141s, the drain electrode 141d, and the channel pattern 141c are called the upper conductive member in all.

According to the upper conductive member according to the second embodiment of the present invention, only the channel pattern 141c is positioned on the upper part of the ferroelectric organic layer 120 and the protective layer 130, and the source electrode 141s and the drain electrode 141d are positioned on the sides of the ferroelectric organic layer 120 and the protective layer 130. However, even in the case where only a part of the upper conductive member is positioned on the upper part of the ferroelectric organic layer 120 and the protective layer 130, it is considered that the upper conductive member is positioned on the upper part of the ferroelectric organic layer 120 and the protective layer 130.

In the second embodiment of the present invention, the ferroelectric organic layer 120 and the protective layer 130 are included, and the lower conductive member, the source electrode 141*s*, the drain electrode 141*d*, and the channel pattern 141*c* constitute a IT (I Transistor) type nonvolatile memory cell.

In the second embodiment of the present invention, the ferroelectric organic layer 120 has the polarization characteristic in accordance with the voltage being applied to the lower conductive member 110 that is the gate electrode, and this polarization characteristic is maintained constant even if the voltage is cut off. Accordingly, in the second embodiment of the present invention, a nonvolatile memory device having a simple IT structure, in which the source electrode 141*s* is grounded, and data is read through the drain electrode 141*d*, can be fabricated.

Figure 14:
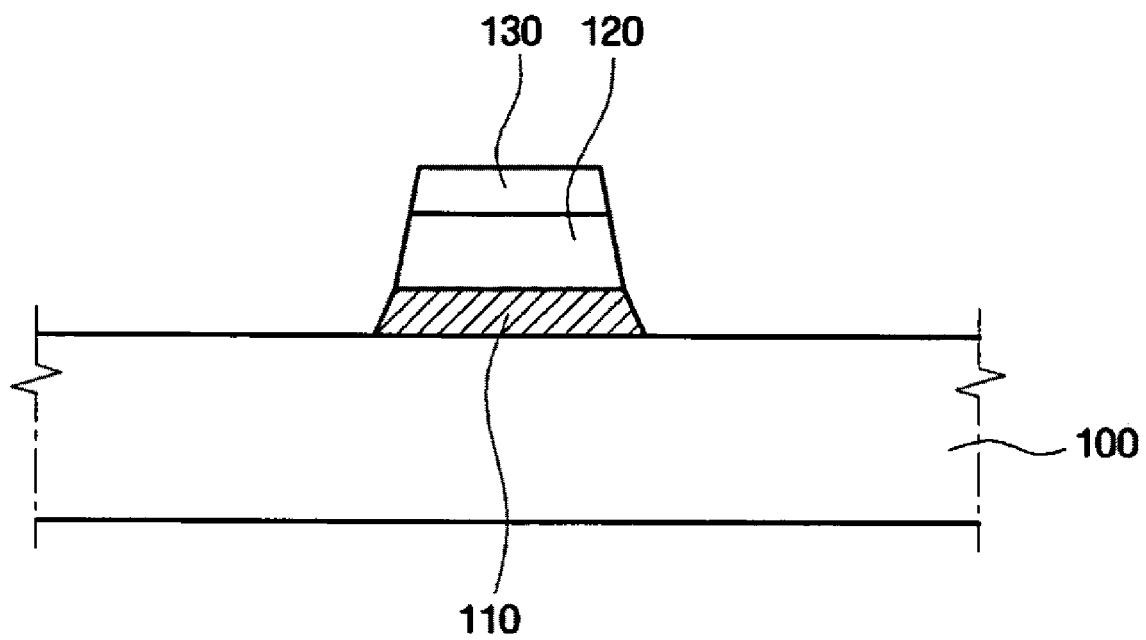
FIGS. 14 and 15 are sectional views illustrating a method of fabricating a nonvolatile memory device by processes according to the second embodiment of the present invention.
Figure 15:
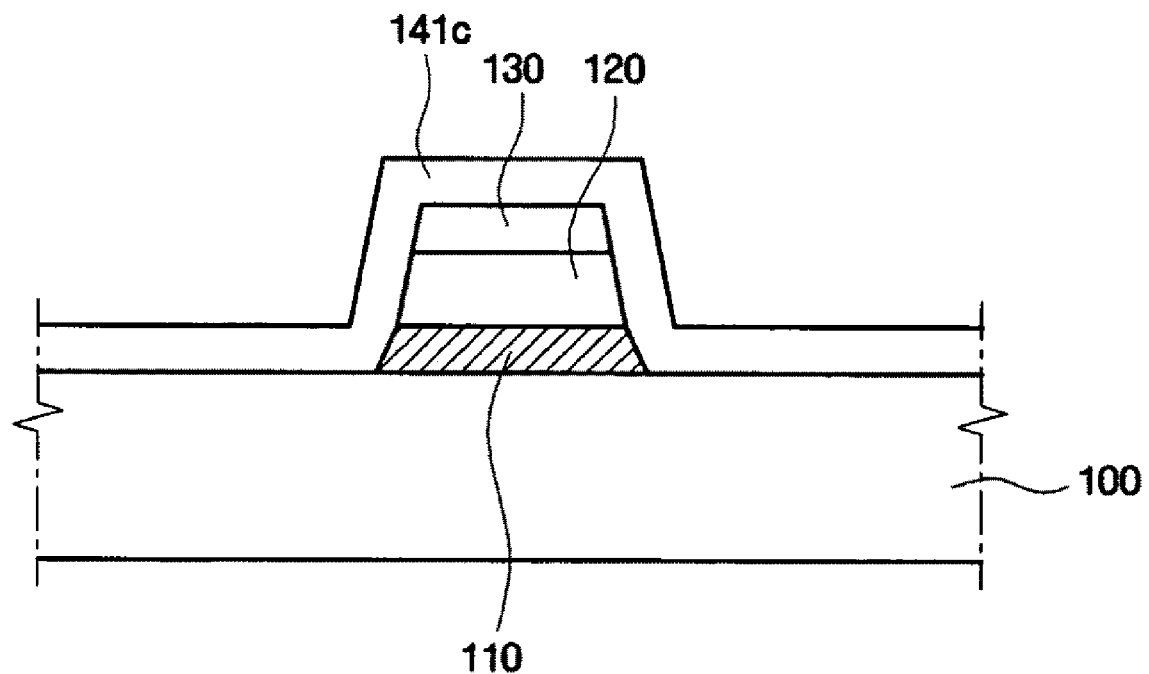

Hereinafter, with reference to FIGS. 13 to 15, a method of fabricating a nonvolatile memory device according to a second embodiment of the present invention will be described in detail. FIGS. 14 and 15 are sectional views illustrating a method of fabricating a nonvolatile memory device by processes according to a second embodiment of the present invention.

Referring to FIG. 14, in the same manner as the method of fabricating a nonvolatile memory device according to the first embodiment of the present invention, the lower conductive member 110 is formed on the substrate 100. The lower conductive member 110 may be composed of lower electrode patterns, e.g., linear patterns formed in a first direction.

Then, the ferroelectric organic layer 120 and the protective layer 130 are formed on the upper part of the lower conductive member 110. The ferroelectric organic layer 120 and the protective layer 130 may be formed to overlap the lower conductive member 110, or may be formed on the whole surface of the substrate 100. The process of forming the protective layer 130 may be omitted in the same manner as in the first embodiment of the present invention.

Referring to FIG. 15, the channel pattern 141*c* is formed on the upper part of the ferroelectric organic layer 120 or the protective layer 130. The channel pattern 141*c* may be formed in a second direction to overlap the lower conductive member 110, or may be formed on the whole surface of the substrate 100.

Last, referring back to FIG. 13, the source electrode 141*s* and the drain electrode 141*d* are formed on the upper part of the channel pattern 141*c* using the nano-transfer printing method.

Figure 16:
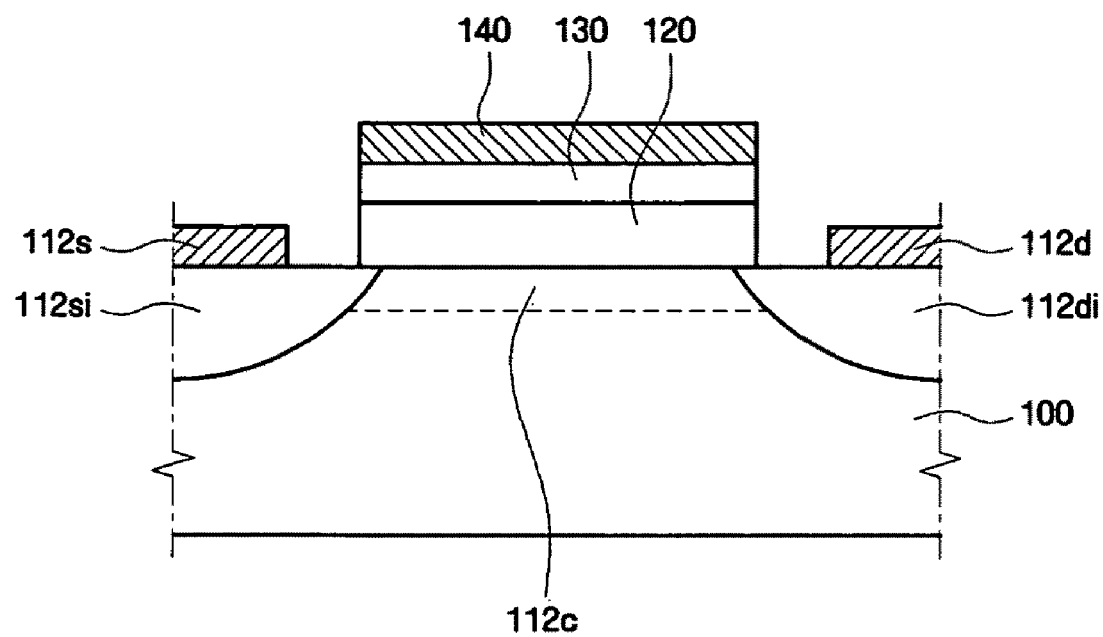
FIG. 16 is a sectional view of a nonvolatile memory device according to a third embodiment of the present invention.

Hereinafter, with reference to FIG. 16, a nonvolatile memory device according to a third embodiment of the present invention will be described in detail. FIG. 16 is a sectional view of a nonvolatile memory device according to a third embodiment of the present invention.

Referring to FIG. 16, the lower conductive member 110 according to the third embodiment of the present invention has a shape different from that in the previous embodiments of the present invention. The ferroelectric organic layer 120 and the protective layer 130 are formed on the substrate 100, and a lower source region 112*si* and a lower drain region 112*di* are arranged apart from each other inside the substrate 100 around the ferroelectric organic layer 120 and the protective layer 130. The lower source region 112*si* and the lower drain region 112*di* are electrically connected to the lower source electrode 112*s* and the lower drain electrode 112*d*, respectively. A channel region 112*c* is arranged between the lower source region 112*si* and the lower drain region 112*di*. The lower source region 112*si*, the lower drain region 112*di*, the lower source electrode 112*s* and the lower drain electrode 112*d*, and the channel region 112*c* are called the lower conductive member 110 in all. In the embodiment of the present invention, even in the case where only a part of the lower conductive member 110 is positioned on the lower part of the ferroelectric organic layer 120, it is considered that the lower conductive member 110 is positioned on the lower part of the ferroelectric organic layer 120.

On the upper part of the protective layer 130, the upper conductive member 140 is formed. The upper conductive member 140, the lower source electrode 112*s*, and the lower drain electrode 112*d* may be formed by a nano-transfer printing method.

In the embodiment of the present invention, the ferroelectric organic layer 120 and the protective layer 130 are included, and the upper conductive member 140, the source electrode 112*s*, the drain electrode 112*d*, and the channel pattern 112*c* constitute a IT (I Transistor) type nonvolatile memory cell.

In the third embodiment of the present invention, the upper conductive member 140 functions as a gate electrode, and the ferroelectric organic layer 120 has the polarization characteristic in accordance with the voltage being applied to the gate electrode. In accordance with the polarization characteristic, a transfer channel is formed in the channel pattern 141*c* between the lower source region 112*si* and the lower drain region 112*di*, and current flows through the source electrode 112*s* and the drain electrode 112*d*. In this structure, even if the voltage being applied through the gate electrode is intercepted, the polarization characteristic of the ferroelectric organic layer 120 is continuously maintained, and thus the nonvolatile memory can be implemented by one transistor only, without providing a separate capacitor.

Figure 17:
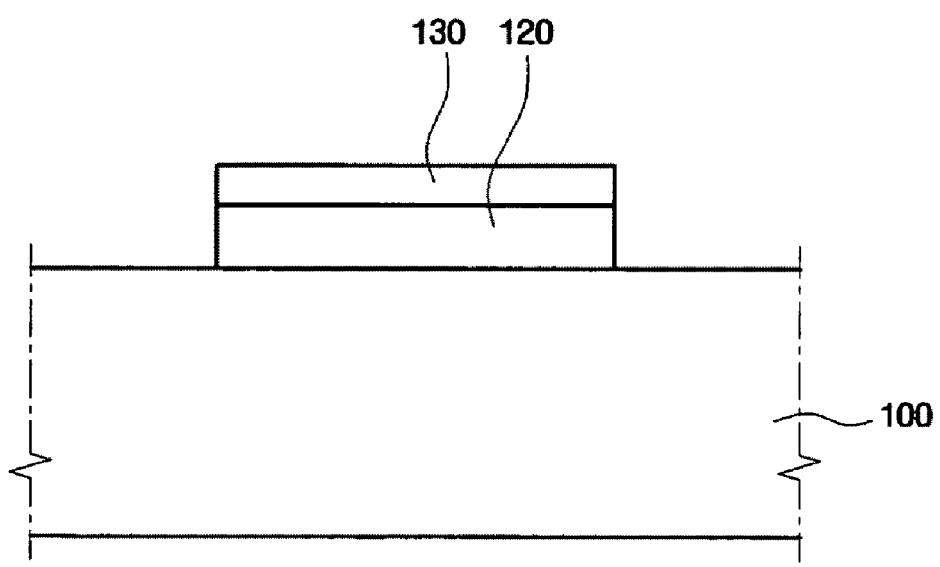
FIGS. 17 to 19 are sectional views illustrating a method of fabricating a nonvolatile memory device by processes according to the third embodiment of the present invention.
Figure 18:
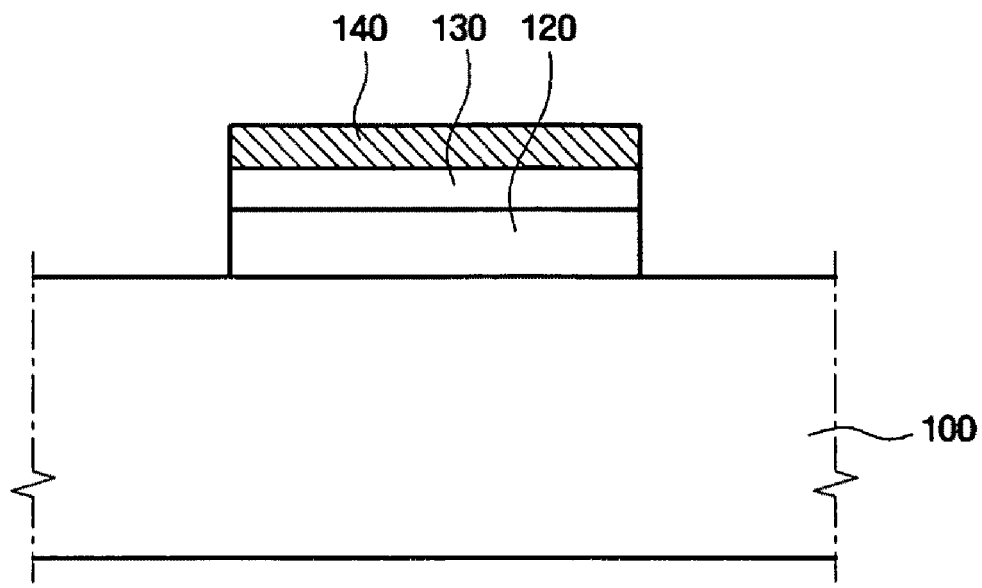
Figure 19:
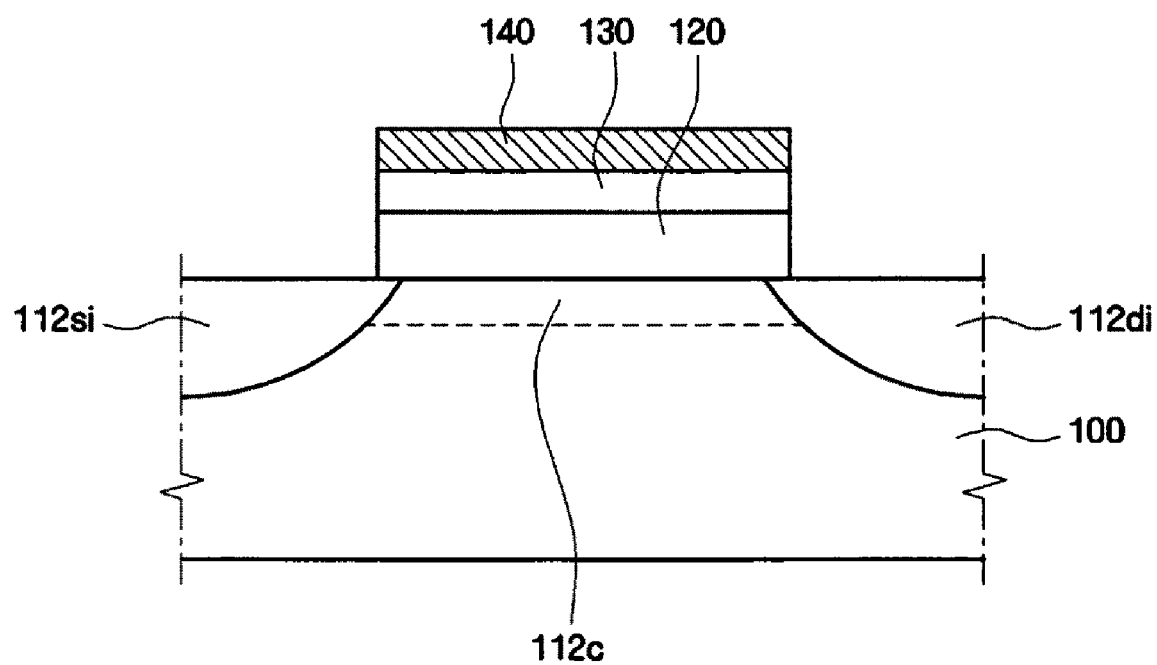

Hereinafter, with reference to FIGS. 16 to 19, a method of fabricating a nonvolatile memory device according to a third embodiment of the present invention will be described in detail. FIGS. 17 to 19 are sectional views illustrating a method of fabricating a nonvolatile memory device by processes according to a third embodiment of the present invention.

Referring to FIG. 17, the ferroelectric organic layer 120 and the protective layer 130 are formed on the substrate 100. The protective layer 130 may be omitted.

Then, referring to FIG. 18, the upper conductive member 140 is formed using a nano-transfer printing method.

Then, referring to FIG. 19, the lower source region 112*si* and the lower drain region 112*di* are formed by injecting impurities into the substrate 100 that is exposed by the upper conductive member 140.

Last, referring back to FIG. 16, on the upper part of the lower source region 112*si* and the lower drain region 112*di*, the lower source electrode 112*s* and the lower drain electrode 112*d* are formed using a nano-transfer printing method. In the embodiment of the present invention, the upper conductive member 140 may be formed simultaneously with the forming of the lower source electrode 112*s* and the lower drain electrode 112*d* after the lower source region 112*si* and the lower drain region 112*di* are formed.

Figure 20:
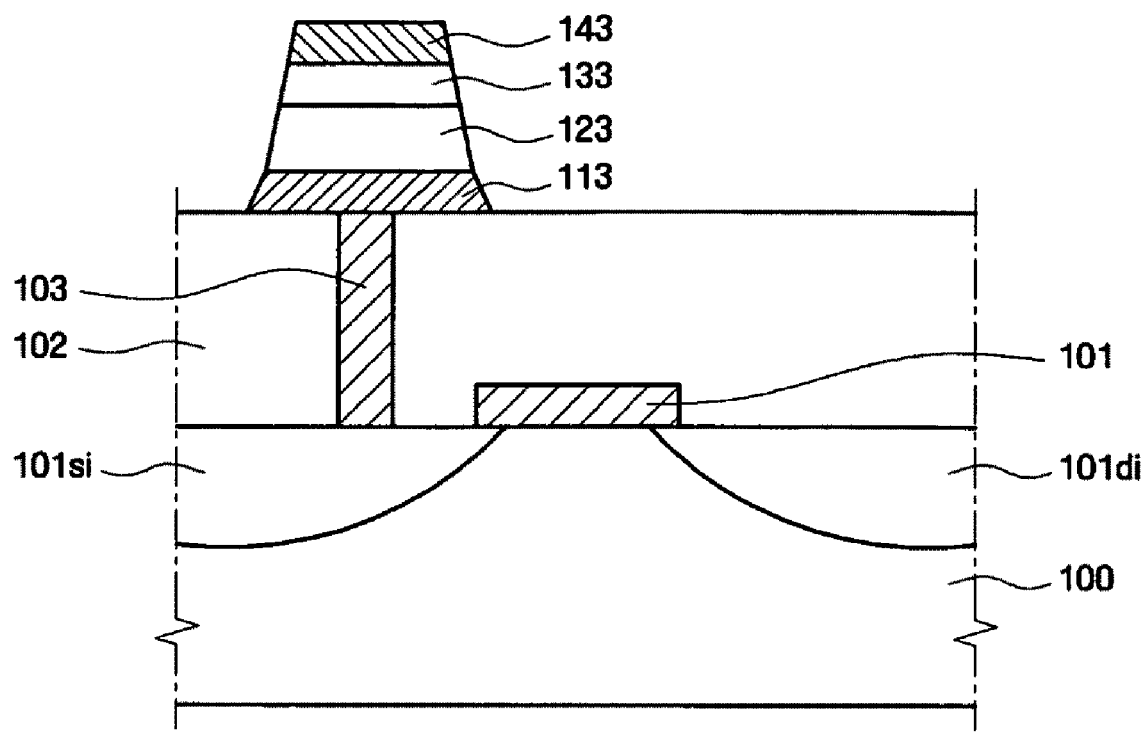
FIG. 20 is a sectional view of a nonvolatile memory device according to a fourth embodiment of the present invention.

Hereinafter, with reference to FIG. 20, a nonvolatile memory device according to a fourth embodiment of the present invention will be described in detail. FIG. 20 is a sectional view of a nonvolatile memory device according to a fourth embodiment of the present invention.

Referring to FIG. 20, the nonvolatile memory device according to the fourth embodiment of the present invention includes a gate electrode 101, a source region 101*si* and a drain region 101*di* formed apart from each other inside the substrate 100 around the gate electrode.

On the upper part of the gate electrode 101, an interlayer insulating layer 102 that covers the gate electrode 101 is formed. The interlayer insulating layer 102 insulates a lower conductive member 113 and the gate electrode 101 from each other.

The lower conductive member 113 is connected to a source region 101si and a drain region 101di via a lower conductive member contact 103.

On the upper part of the lower conductive member 113, a ferroelectric organic layer 123 and a protective layer 133 are formed through patterning. In the fourth embodiment of the present invention, the protective layer 133 may also be omitted, and an upper conductive member 143 is formed on the upper part of the ferroelectric organic layer 123 and the protective layer 133 using a nano-transfer printing method. The lower conductive member 113, the upper conductive member 143, and the ferroelectric organic layer 123 interposed between the lower and upper conductive members 113 and 143 constitute a capacitor.

The nonvolatile memory device according to the fourth embodiment of the present invention is a 1T-1C (1Transistor-Capacitor) type memory device, and has a structure similar to a conventional DRAM.

Hereinafter, with reference to FIGS. 20 to 24, a method of fabricating a nonvolatile memory device according to a fourth embodiment of the present invention will be described in detail.

Figure 21:
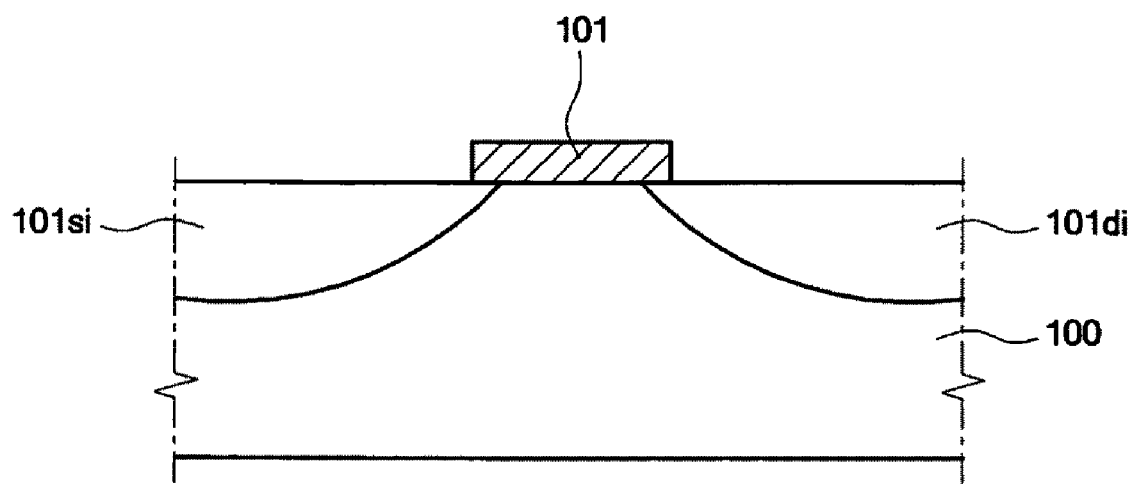
FIGS. 21 to 24 are sectional views illustrating a method of fabricating a nonvolatile memory device by processes according to the fourth embodiment of the present invention.

Referring to FIG. 21, the gate electrode 101 is formed on the substrate 100, and the source region 101si and the drain region 101di are formed by ion-injecting impurities into the substrate 100 on both sides of the gate electrode 101.

Figure 22:
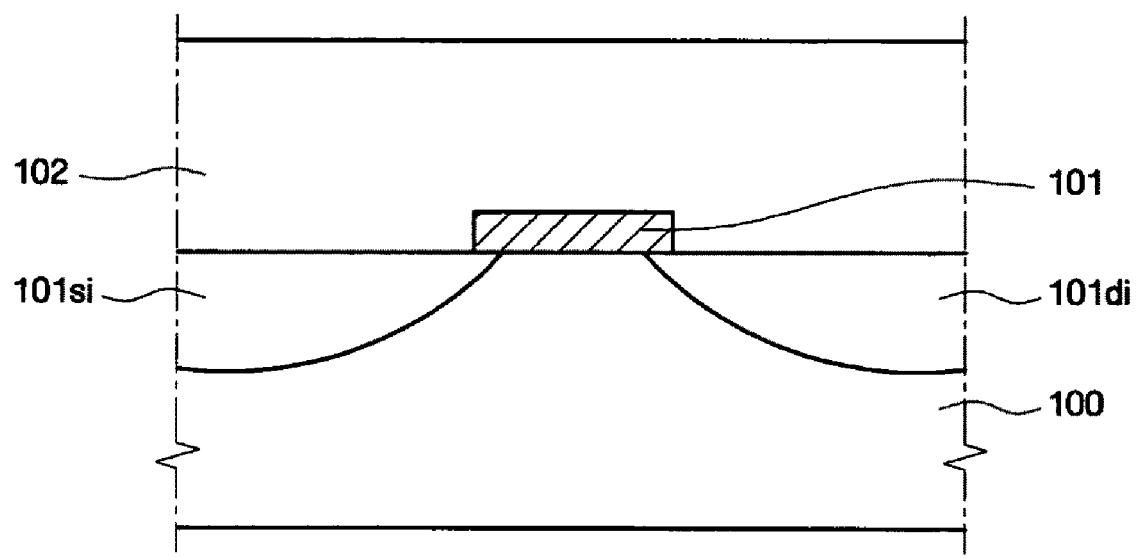

Referring to FIG. 22, the interlayer insulating layer 102 covering the gate electrode 101 is formed. The interlayer insulating layer 102 may be formed using a CVD method, a spin coat method, or the like.

Figure 23:
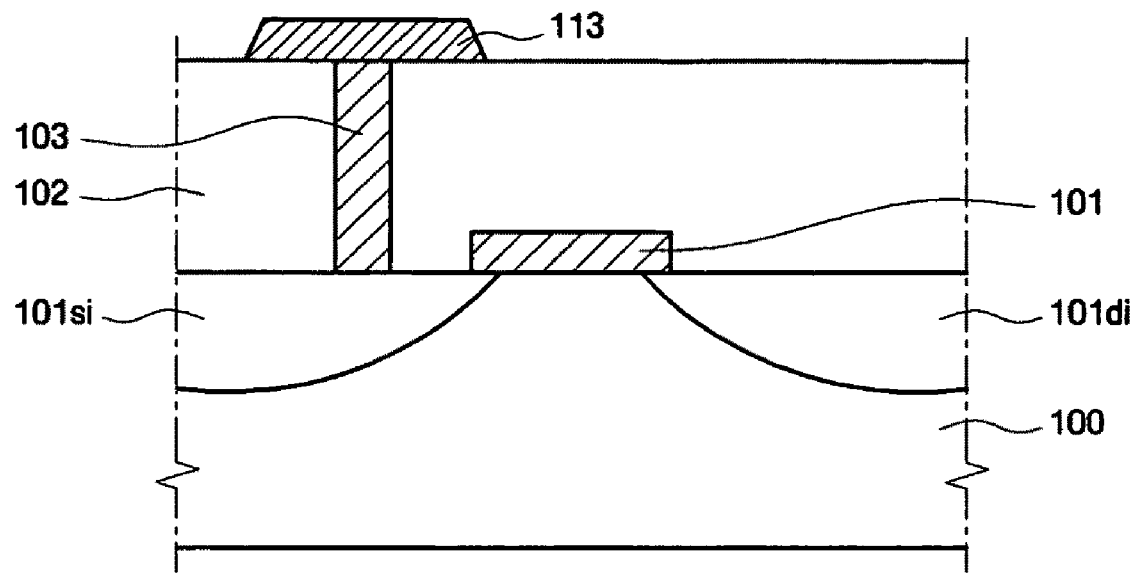

Referring to FIG. 23, a contact hole (not illustrated) is formed on the interlayer insulating layer 102, and a lower conductive member contact material is filled in the contact hole to form the lower conductive member 103. Then, the lower conductive member 113 is formed on the upper part of the lower conductive member contact 103. The lower conductive member 113 is connected to the source region 101si or the drain region 101di by the lower conductive member contact 103.

Figure 24:
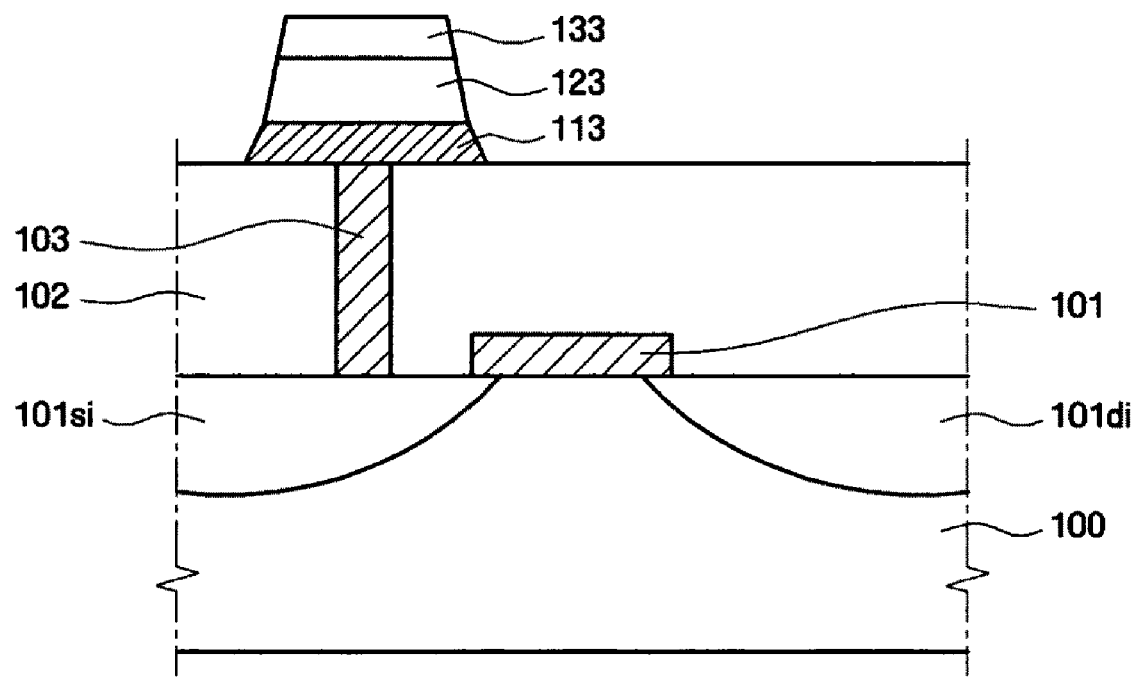

Referring to FIG. 24, the ferroelectric organic layer 123 and the protective layer 133 are formed on the upper part of the lower conductive member 113. In the fourth embodiment of the present invention, the protective layer 133 may also be omitted.

Last, referring back to FIG. 25, the upper conductive member 143 is formed on the upper part of the ferroelectric organic layer 123 or the protective layer 133 using a nano-transfer printing method.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of fabricating a nonvolatile memory device, comprising:

forming a first conductive member on or inside a substrate;

forming a ferroelectric organic layer on the first conductive member, wherein the ferroelectric organic layer comprises a polymer material; and forming a second conductive member on the ferroelectric organic layer, wherein the second conductive member crosses the first conductive member, and wherein the forming of the second conductive member comprises providing a mold on which patterns of the second conductive member are formed, heating the substrate at a temperature higher than a glass transition temperature of the ferroelectric organic layer, and transferring the patterns of the second conductive member to the ferroelectric organic layer by pressing the mold on which the patterns of the second conductive member are formed onto the ferroelectric organic layer.

2. The method of claim 1, wherein the first conductive member is a first electrode formed in a first direction on the substrate, and the second conductive member is a second electrode formed in a second direction distinct from the first direction.

3. The method of claim 1, wherein the forming of the second conductive member comprises forming on the ferroelectric organic layer a channel pattern, a source electrode and a drain electrode, the electrodes being connected to the channel pattern and arranged apart from each other.

4. The method of claim 1, wherein the forming of the first conductive member comprises forming in the substrate a channel pattern, a source electrode and a drain electrode, the electrodes being connected to the channel pattern and arranged apart from each other.

5. The method of claim 1, further comprising forming a gate electrode, a source region, and a drain region in the substrate before the forming of the first conductive member, wherein the first conductive member is electrically connected to the source region or the drain region.

6. A method of fabricating a nonvolatile memory device, comprising:

forming a first conductive member on or inside a substrate;

forming a ferroelectric organic layer on the first conductive member;

forming a protective layer on the ferroelectric organic layer, wherein the ferroelectric organic layer and the protective layer are made of a polymer material, and a glass transition temperature of the protective layer is lower than a glass transition temperature of the ferroelectric organic layer; and forming a second conductive member on the protective layer, wherein the second conductive member crosses the first conductive member, and wherein the forming of the second conductive member comprises providing a mold on which patterns of the second conductive member are formed, heating the protective layer at a temperature that is higher than the glass transition temperature of the protective layer, but is lower than the glass transition temperature of the ferroelectric organic layer, and transferring the patterns of the second conductive member to the protective layer by pressing the mold on which the patterns of the second conductive member are formed onto the protective layer.

7. The method of claim 6, wherein the first conductive member is a first electrode formed in a first direction on the substrate, and the second conductive member is a second electrode formed in a second direction distinct from the first direction.

8. The method of claim 6, wherein the forming of the second conductive member comprises forming on the ferroelectric organic layer a channel pattern, a source electrode and a drain electrode, the electrodes being connected to the channel pattern and arranged apart from each other.

9. The method of claim 6, wherein the forming of the first conductive member comprises forming in the substrate a channel pattern, a source electrode and a drain electrode, the electrodes being connected to the channel pattern and arranged apart from each other, other.

10. The method of claim 6, further comprising forming a gate electrode, a source region, and a drain region in the substrate before the forming of the first conductive member;
   wherein the first conductive member is electrically connected to the source region or the drain region.

11. A method of fabricating a nonvolatile memory device, comprising:
   forming a first electrode formed in a first direction on a substrate;
   forming a ferroelectric organic layer comprising a polymer material on the first electrode;
   forming a protective layer comprising a polymer material having a glass transition temperature lower than a glass transition temperature of the ferroelectric organic layer on the ferroelectric organic layer; and
   forming a second electrode formed in a second direction on the protective layer to cross the first electrode, wherein the forming of the second electrode comprises heating the protective layer at a temperature that is higher than the glass transition temperature of the protective layer, but is lower than the glass transition temperature of the ferroelectric organic layer, and transferring second electrode patterns to the protective layer by pressing a mold, on which the second electrode patterns are formed, onto the protective layer.

* * * * *